United States Patent
Kusunoki

(10) Patent No.: US 9,350,578 B2
(45) Date of Patent: May 24, 2016

(54) SIGMA-DELTA MODULATION APPARATUS AND SIGMA-DELTA MODULATION POWER AMPLIFIER

(71) Applicant: Sony Corporation, Tokyo (JP)

(72) Inventor: Shigeo Kusunoki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 14/543,954

(22) Filed: Nov. 18, 2014

(65) Prior Publication Data
US 2015/0188740 A1    Jul. 2, 2015

Related U.S. Application Data

(60) Provisional application No. 61/922,995, filed on Jan. 2, 2014.

(51) Int. Cl.
*H04L 25/49*      (2006.01)
*H03M 3/00*      (2006.01)
(Continued)

(52) U.S. Cl.
CPC .......... *H04L 25/4902* (2013.01); *H03F 3/2175* (2013.01); *H03M 3/30* (2013.01); *H03M 3/368* (2013.01); *H03M 3/504* (2013.01); *H04B 1/7103* (2013.01); *H04L 7/0091* (2013.01); *H04L 27/36* (2013.01); *H03F 2200/331* (2013.01)

(58) Field of Classification Search
CPC ........... H03F 2200/331; H03F 1/3241; H04B 2001/0425; H04B 1/707; H04B 1/00; H04B 3/00; H04B 7/00; H04B 10/00; H04B 13/00; H04B 14/00; H04B 15/00; H04L 27/367; H04L 5/00; H04L 15/00; H04L 17/00

USPC .................................. 375/295–297, 146, 238
See application file for complete search history.

(56) References Cited

U.S. PATENT DOCUMENTS 6,583,679 B1   6/2003   Cox et al.
7,230,996 B2 *   6/2007   Matsuura et al. ............. 375/296
(Continued)

FOREIGN PATENT DOCUMENTS

JP      2011-041002 A    2/2011
JP      2013-089997 A    5/2013
KR   10-2013-0065293 A    6/2013

OTHER PUBLICATIONS

Extended European Search Report issued May 13, 2015 in Patent Application No. 14199467.3.

*Primary Examiner* — Emmanuel Bayard
(74) *Attorney, Agent, or Firm* — Oblon, McClelland, Maier & Neustadt, L.L.P.

(57) ABSTRACT

To suppress noise generation in a wide band and to suppress a clock speed from being increased in a sigma-delta modulation apparatus and a sigma-delta modulation power amplifier. A sigma-delta modulator creates a sigma-delta modulated signal for a digital output from a digital modulator, according to a clock given in advance. A threshold comparator indexes a portion in which the level of a digital output from the digital modulator is higher than a predetermined threshold and sends the resulting output. A replacing unit replaces the indexed portion with an output from a corresponding thinning unit. A filter unit performs band elimination filter processing on an output from the replacing unit and a digital-to-analog converter (D/A) performs digital-to-analog conversion on an output from the filter unit.

21 Claims, 12 Drawing Sheets

(51) Int. Cl.
*H04L 7/00* (2006.01)
*H04B 1/7103* (2011.01)
*H03F 3/217* (2006.01)
*H04L 27/36* (2006.01)

(56) References Cited

U.S. PATENT DOCUMENTS 7,528,754 B1 * 5/2009 Bakkaloglu et al. .......... 341/143
7,715,490 B2 * 5/2010 Rezeq ........................... 375/295
8,873,611 B2 * 10/2014 Hori et al. ..................... 375/227
9,014,306 B2 * 4/2015 Etemadi ........................ 375/331
2007/0018718 A1 * 1/2007 Horng et al. .................... 330/10
2008/0205571 A1 * 8/2008 Muhammad et al. ......... 375/376
2010/0128775 A1 * 5/2010 Kim et al. ..................... 375/238
2012/0250754 A1 * 10/2012 Heinrich ................. H03F 3/217
375/238
2012/0262214 A1 * 10/2012 Hori .............................. 327/291

* cited by examiner

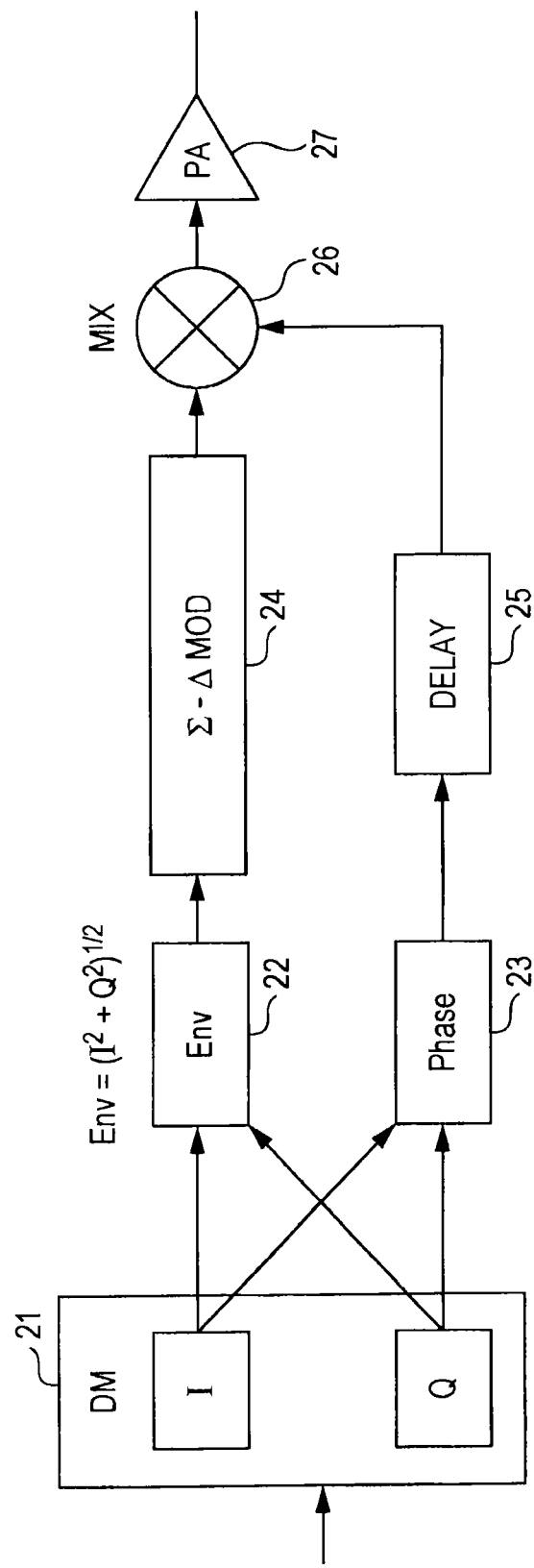

FIG. 9A

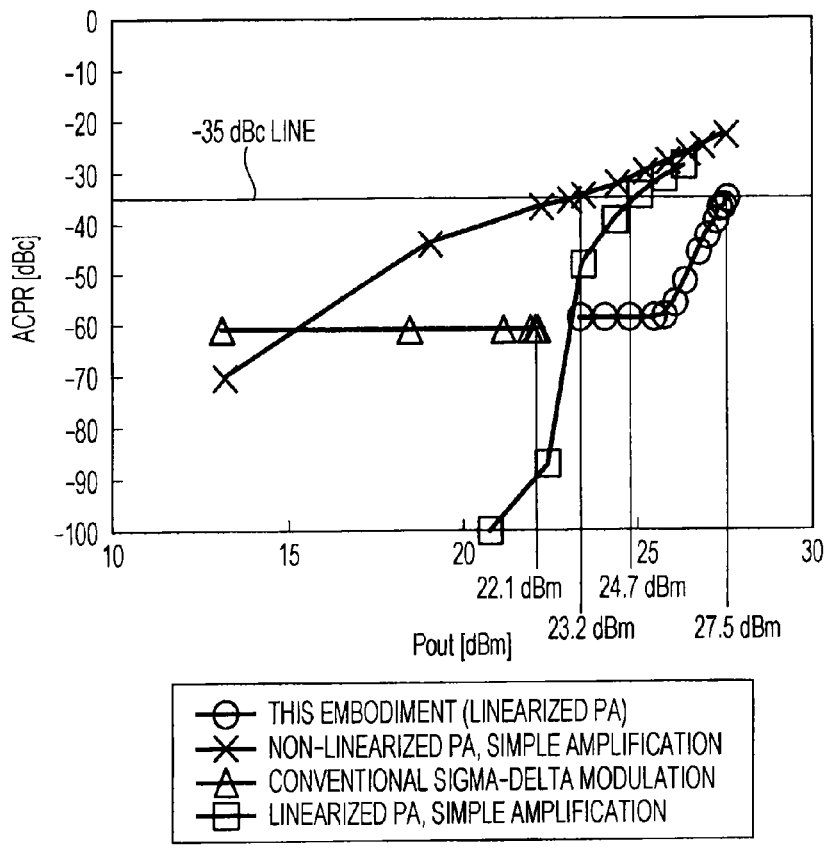

- ○ THIS EMBODIMENT (LINEARIZED PA)
- × NON-LINEARIZED PA, SIMPLE AMPLIFICATION
- △ CONVENTIONAL SIGMA-DELTA MODULATION
- □ LINEARIZED PA, SIMPLE AMPLIFICATION

FIG. 9B

PARAMETERS USED IN SIMULATION

| | |
|---|---|
| PA | InGap GaAs HBT FOR CDMA2000 |
| CLOCK IN THIS EMBODIMENT | 50-FOLD OVERSAMPLING |
| Vth IN THIS EMBODIMENT | 0.3 V |
| DIGITAL VOLTAGE IN THIS EMBODIMENT | 1.8 V |
| SIGNAL | UPLINK IN LTE (20-MHz BANDWIDTH) |
| CLOCK IN CONVENTIONAL SIGMA-DELTA MODULATION | 50-FOLD OVERSAMPLING |
| SATURATED OUTPUT FROM PA | 30.45 dBm |
| CUTOFF BAND OF BEF_D | TWICE TRANSMISSION BAND (40 MHz) |
| ORDER OF FIR LPF IN SIGMA-DELTA DEMODULATION | EIGHTH ORDER |

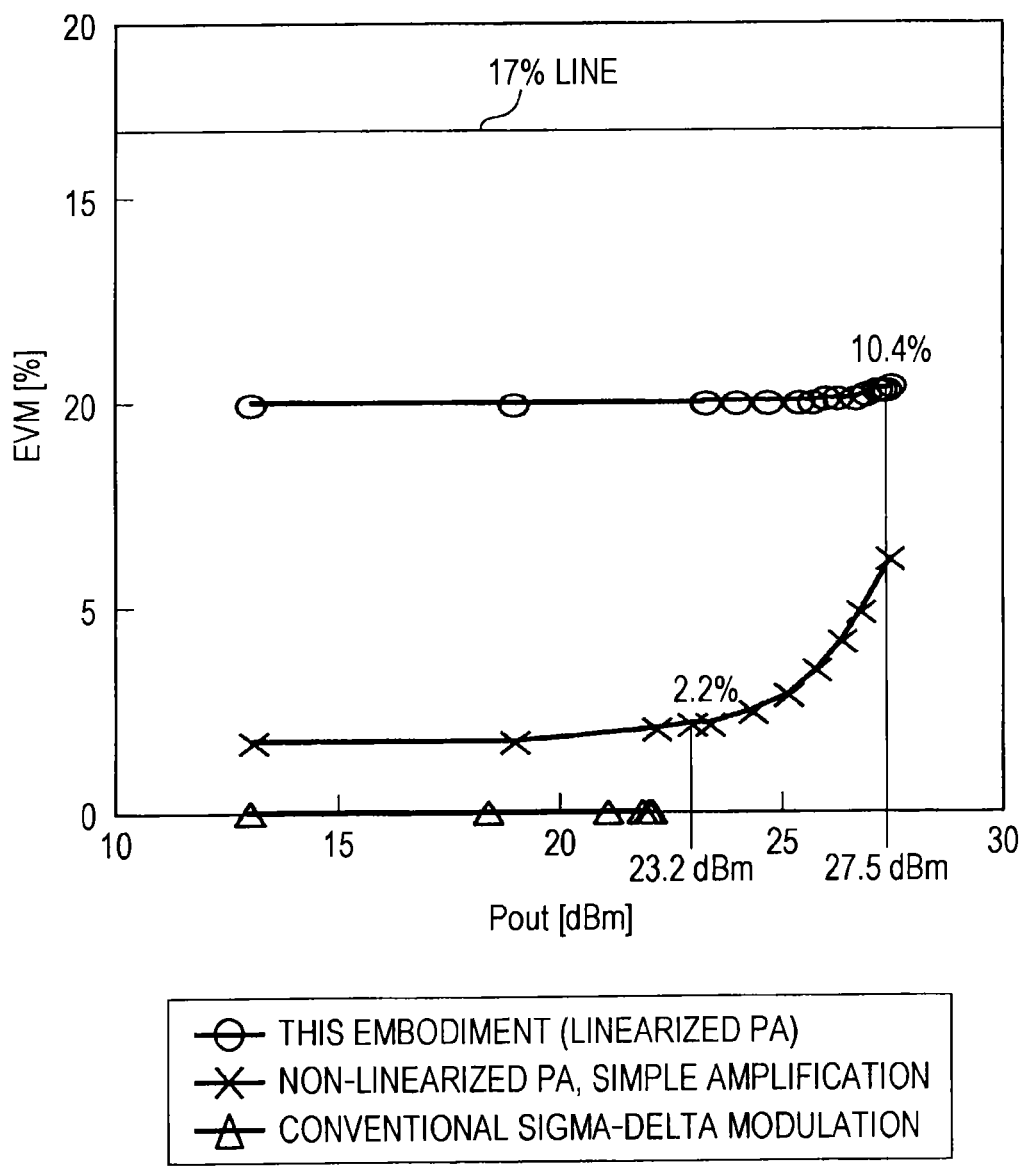

SIGMA-DELTA MODULATION APPARATUS AND SIGMA-DELTA MODULATION POWER AMPLIFIER

CROSS-REFERENCE TO RELATED APPLICATIONS

This application is based upon and claims the benefit of priority from the prior U.S. Provisional Application 61/922, 995, filed Jan. 2, 2014, the entire contents of which are incorporated herein by reference.

BACKGROUND OF THE INVENTION

1. Field of the Invention

The present invention relates to a power amplifier that can be used in digital mobile communication and mobile telephones, and more particularly to a sigma-delta modulation apparatus related to a power amplifier to which sigma-delta modulated signals can be applied and to a sigma-delta modulation power amplifier that uses the sigma-delta modulation apparatus.

2. Description of the Related Art

It is preferable for a single mobile telephone such as a smart phone to be adaptable to both the wideband CDMA (W-CDMA) and CDMA2000 communication methods in the third-generation (3G) and the long term evolution (LTE) communication method in the fourth-generation (4G). It is also preferable to cover a plurality of frequency bands to operate in many regions throughout the world. A power amplifier (PA) that uses this type of mobile telephone needs to operate on signals having different peak-to-average power ratios (PAPRs), at different frequencies, and in different operating bands. In addition, since the power amplifier usually consumes much power, it is also required to be highly efficient. Furthermore, the power amplifier is required to operate more linearly to meet standardized distortion.

The efficiency of the power amplifier has a deep relationship with linear operation. To obtain high linearity, the efficiency is lowered. That is, as the PAPR of a signal to be amplified becomes larger, higher linearity is needed and operation efficiency must be lowered. The PAPRs of signals in the above W-CDMA and CDMA2000 are about 3.5 dB, but the PAPR in SC-FCDMA in LTE is about 8 dB. If carrier aggregation (CA), standardization of which will be considered in LTE, is used for transmission from a terminal, that is, for an uplink, the PAPR changes depending on the number of frequency bands to be bound.

Different power amplifiers have been conventionally used for different applications to adapt to complex signal structures. Necessarily, this requires many power amplifiers to be mounted in a small terminal and thereby imposes strain on a request to make the mobile telephone compact.

This situation places many burdens on the entire structure of a communication LSI, so a wireless unit that can be adapted to all communication methods by using software is being studied. A power amplifier requested here is such that a single power amplifier can cover all applications independently of the communication method.

As a conventional power amplifier that meets this requirement, the study of a switching-type power amplifier is being progressed. The switching-type power amplifier is advantageous in that since the power amplifier always performs saturated operation, efficiency can be made high. However, all current signals for mobile telephones have information in the amplitude direction, amplification by a certain amplitude is not possible. Therefore, a study is being made to use signals to which sigma-delta modulation has been applied in the switching-type power amplifier. In, for example, PTL 1 "Digitally Controlled Oscillation Device" (Japanese Unexamined Patent Application Publication No. 2013-089997), there is an attempt to reduce wideband noise by optimizing the set resolution of an oscillation clock. In PTL 2 "High Frequency Amplifier and Efficiency Increasing Method" (Japanese Unexamined Patent Application Publication No. 2011-041002), an attempt to improve switching efficiency by optimizing the load of a switching power amplifier is proposed. These attempts are to transmit information in the amplitude direction by using pulse density modulation (PDM). This enables the switching power amplifier to be used without alteration, so highly efficient operation can be expected.

PRIOR ART DOCUMENTS

Patent Literature

[PTL 1] Japanese Unexamined Patent Application Publication No. 2013-089997
[PTL 2] Japanese Unexamined Patent Application Publication No. 2011-041002

SUMMARY OF THE INVENTION

However, the conventional power amplifier that uses sigma-delta modulated signals has some problems as described below.

A first problem concerns spread of a spectrum. FIG. 2 shows a typical output spectrum of a conventional sigma-delta modulator. This drawing shows an output spectrum in a baseband after sigma-delta modulation. This signal is up-converted to a radio frequency and is amplified by a power amplifier. FIG. 2 illustrates a case in which the signal is SC-FCDMA, which is an LTE up-link signal, with a bandwidth of 20 MHz. All portions in the drawing except a portion marked with transmission signal TxSg indicate digital noise due to sigma-delta modulation. This noise is low in a portion near the transmission band; as frequency detuning becomes larger, the noise level is increased. If a radio frequency is up-converted, noise appears substantially symmetrically in both a low-frequency area and a high-frequency area, centered around the transmission signal. In the case of a frequency division duplex (FDD) communication method, if an area of this noise overlaps a reception band, reception interference occurs. Furthermore, adjacent-channel leakage power (ACP) may be increased depending on the setting of a modulation parameter.

A second problem is that since energy is distributed to the noise component over a wide frequency band, energy distributed to the transmission signal is reduced; as a result, the efficiency of the power amplifier is reduced.

A third problem concerns the frequency of a clock used in sigma-delta modulation. In sigma-delta modulation, the pulse density of a sigma-delta modulated output changes depending on the differential value of a signal to be modulated (envelope described later). In general, about 50 times an envelope frequency is needed as the clock to be used in sigma-delta modulation. In the case of LTE full-band communication, for example, a bandwidth (BW) of 20 MHz is the envelope frequency, so the clock frequency, which is 50 times as high as the bandwidth, is 1 GHz. To implement the clock, therefore, there are many restrictions such as the clock's precision and current draw.

A fourth problem is that a switching power amplifier is needed as a power amplifier placed at a stage behind the sigma-delta modulation apparatus. That is, to enable the power amplifier to precisely pass a high-speed pulse, which is a sigma-delta modulated output, it is necessary to reduce, to a small value, the time constant of a matching circuit, formed with a coil, a capacitor, and the like, which is placed near a semiconductor that is part of the power amplifier. Therefore, a special switching power amplifier for which these have been adjusted is needed.

The conventional technologies described in PTLs 1 and 2 described above are susceptible to further improvement to meet power amplifier's properties needed for practical use.

The inventor recognizes the necessity of a sigma-delta modulation apparatus and a sigma-delta modulation power amplifier that can solve the problems described above.

A sigma-delta modulation apparatus in an embodiment of the present invention includes a threshold comparator that gives an index to a portion in which the level of a digital output from a digital modulator is higher than a predetermined threshold and sends the resulting output, the digital modulator being configured to create a digital transmission signal in digital communication, a sigma-delta modulator that creates a sigma-delta modulated signal, which is a PDM-modulated pulse, for the digital output from the digital modulator according to a clock given in advance, a replacing unit that replaces the portion to which the index has been given, the portion being part of the output from the threshold comparator, with an output from the corresponding thinning unit, a filter unit that performs band elimination filter processing on an output from the replacing unit by a digital filter, and a D/A converting unit that performs digital-to-analog conversion on an output from the filter unit.

A sigma-delta modulation power amplifier in an embodiment of the present invention includes an envelope creating unit that receives modulated outputs I and Q from a digital modulator, which creates a digital transmission signal in digital communication, and outputs its envelope component, a phase creating unit that receives the modulated outputs I and Q and creates their phase components, a sigma-delta modulation apparatus that receives the output from the envelope creating unit, a mixer that creates a sigma-delta quadrature modulated signal by using an output from the sigma-delta modulation apparatus and an output from the phase creating unit, and a power amplifier that receives an output from the mixer and amplifies the output to a desired output; the sigma-delta modulation apparatus includes a threshold comparator that gives an index to a portion in which the level of the output from the envelope creating unit is higher than a predetermined threshold and sends the resulting output, a sigma-delta modulator that creates a sigma-delta modulated signal, which is a PDM-modulated pulse, for the digital output from the digital modulator according to a clock given in advance, a thinning unit that removes PDM-modulated pulses output from the sigma-delta modulator at a ratio specified in advance, a replacing unit that replaces the portion to which the index has been given, the portion being part of the output from the threshold comparator, with an output from the corresponding thinning unit, a filter unit that performs band elimination filter processing on an output from the replacing unit by a digital filter, and a D/A converting unit that performs digital-to-analog conversion on an output from the filter unit.

According to these embodiments of the present invention, it is possible to suppress noise generation in a wide area and to suppress a clock speed from being increased because sigma-delta modulation is applied to a conventional sigma-delta modulation power amplifier only in a portion in which an envelope is high and some modulation pulses are removed to prevent high speed. Another effect is that a conventional power amplifier rather than a special switching power amplifier can be used.

BRIEF DESCRIPTION OF THE DRAWINGS

FIG. 5 is a block diagram showing a first example of the structure of a power amplifier that uses the sigma-delta modulation apparatus shown in FIG. 1.

FIG. 9(a) shows four graphs that represent a relationship between an adjacent-channel leakage power ratio (ACPR) [dBc] and an output (Pout) [dBm], and FIG. 9(b) shows parameters used in simulation performed to obtain this relationship.

FIG. 11 shows three graphs that represent data of an error vector magnitude (EVM).

DETAILED DESCRIPTION OF THE PRESENTLY PREFERRED EMBODIMENTS

Embodiments of the present invention will be described in detail, as below.

Figure 1:
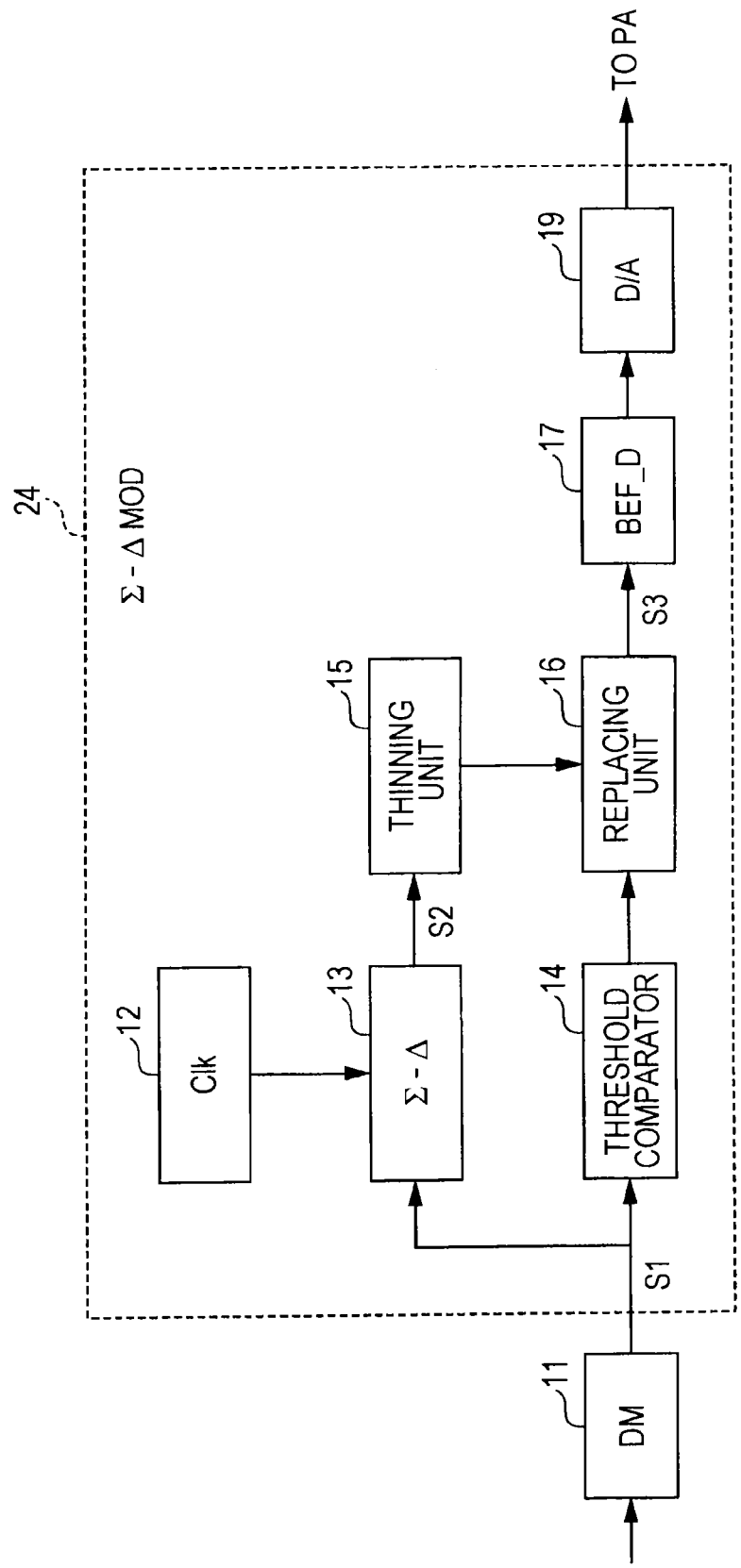
FIG. 1 is a block diagram of a sigma-delta modulation apparatus in this embodiment.
Figure 2:
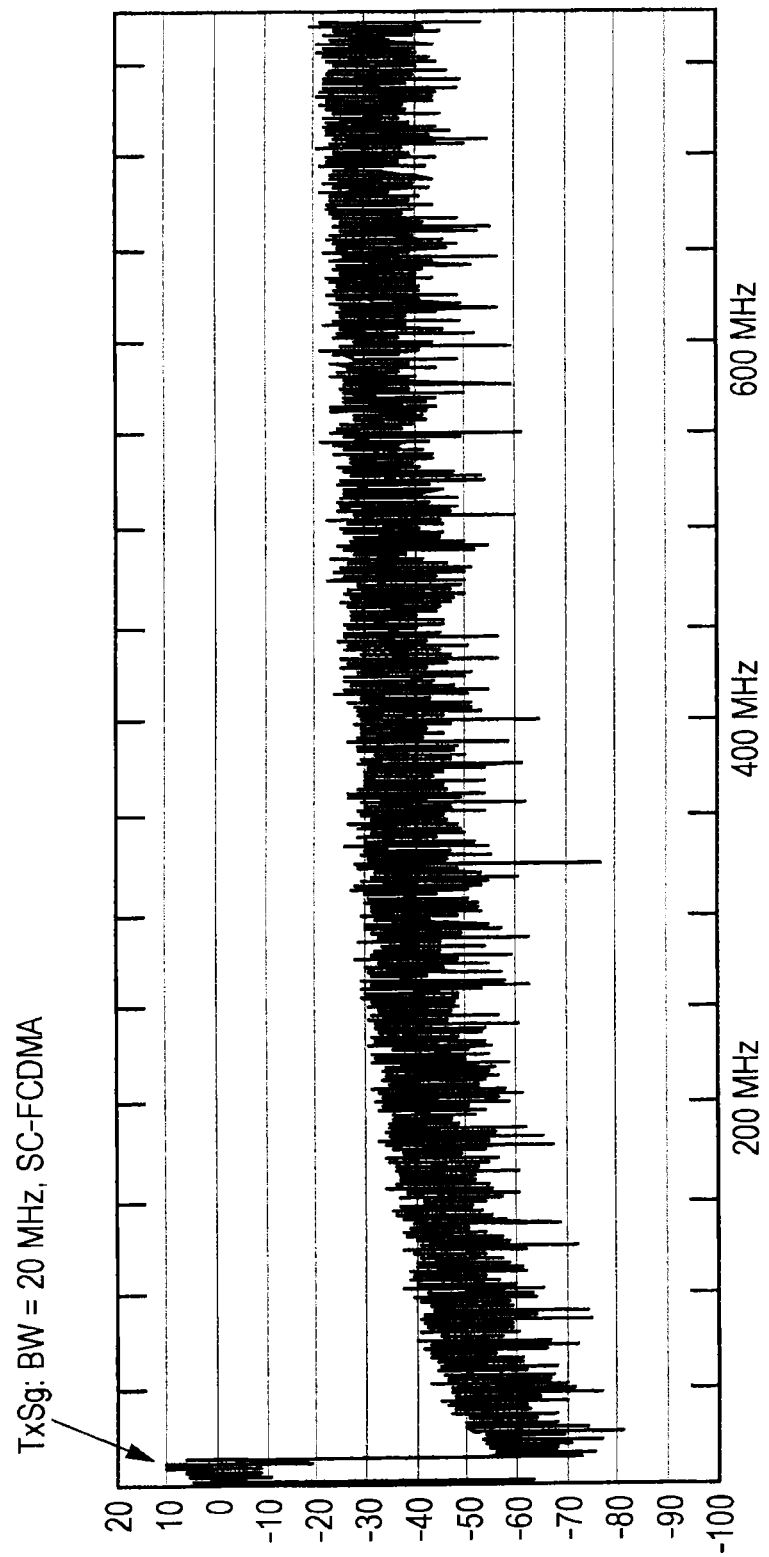
FIG. 2 shows a typical output spectrum of a conventional sigma-delta modulator.

FIG. 1 is a block diagram that schematically shows the structure of a sigma-delta modulation apparatus in this embodiment. In FIG. 1, this sigma-delta modulation apparatus (Σ-Δ MOD) 24 is configured with a clock generator (Clk) 12, a sigma-delta modulator (Σ-Δ) 13, a threshold comparator (Vth) 14, a thinning unit 15, a replacing unit 16, a band elimination filter_digital (BEF_D) 17, and a digital-to-analog converter (D/A) 19. The sigma-delta modulation apparatus 24 receives an output signal S1 from a digital modulator (DM) 11.

The digital modulator (DM) 11 creates a digital transmission signal S1 in digital communication. The output of the digital modulator 11 includes an envelope component to be up-converted later to a radio frequency. In this embodiment, the digital modulator 11 includes an inverse Fourier transformer (IFFT unit) when LTE is used and includes a baseband filter, which is a roll-off filter, when CDMA is used. In the drawing, outputs from them are indicated as the signal S1.

When LTE is used, sub-carrier modulation is performed in QPSK or 16QAM as a digital modulation method to be used. However, another method, such as BPSK or 64QAM, can also be used.

The sigma-delta modulation apparatus 24 in FIG. 1 can use one of first and second quadrature outputs I and Q, which are output from the digital modulator 11, as the signal S1.

The digital signal S1 from the digital modulator (DM) branches into two parts, one of which is input to the sigma-delta modulator 13 and the other of which is input to the threshold comparator (Vth) 14.

The sigma-delta modulator 13 creates a conventional sigma-delta modulated signal for the input of the one of the two branches according to the clock clk from the clock generator 12 and outputs the sigma-delta modulated signal. In this example, a signal S2 is obtained by performing sigma-delta modulation with a clock having a frequency 50 times as high as the frequency of the signal S1. More specifically, in the above sigma-delta modulation in which a clock with a 50-fold frequency is used, the output from the digital modulator 11 is stored in a memory (not shown) and a waveform voltage is added in extrapolation processing, after which sigma-delta modulation processing is performed. Since this processing can be executed by software, a clock with a 50-fold frequency is not needed in actual practice.

In LTE, for example, the IFFT size is 2048, so an analog signal in which one frame includes 2048 points (analog signal formed with quantized digital bits) is output. Since sigma-delta modulation cannot be carried out for this signal by using a clock with the 50-fold frequency without alteration, the number of points is increased by a factor of 50. As a method for this increase, interpolation between points (so-called spline interpolation) is performed. In this embodiment, an interpolation signal is created by creating a sine wave from information about each point and adding the sine wave. In addition to this interpolation, linear interpolation, cubic function interpolation, and the like can be used. A necessary memory is about 100 kilobytes in size (since 2048 bytes is 2 kilobytes, its 50-fold size is 100 kilobytes).

In conventional sigma-delta modulation, 2048-point data has been subjected to D/A conversion and the resulting data has been passed through an LPF to obtain analog data, after which the analog data has been subjected to A/D conversion with a clock with a 50-fold frequency. At that time, a sigma-delta modulation circuit is operated at a time that matches the timing of the A/D conversion. Therefore, processing at about 1 GHz was needed.

The threshold comparator (Vth) 14 compares the signal level of the input of the other of the two branches with a preset threshold Vth. The threshold comparator (Vth) 14 gives an index to a portion in which the signal level is higher than the threshold Vth and sends the resulting output. For example, the threshold comparator (Vth) 14 detects a range in which the absolute value of the signal S1 is larger than Vth and marks the range. As a marking method, a simple method in which, for example, an index signal is used can be used. Alternatively, a signal "1" (a high-level output signal, for example) may be created for a period in which the signal level is higher than the threshold Vth, and a signal "0" (a low-level output signal, for example) may be created for another period. Then, the replacing unit 16 may selectively select the signal S1 and a signal from the thinning unit 15 according to these signals.

The value of the threshold Vth is determined by comprehensively considering distortion, efficient output, and the value of an error vector magnitude (EVM).

The thinning unit 15 performs processing to remove pulses from a pulse-shaped output from the digital modulator 11 at a ratio specified in advance. For example, the thinning unit 15 removes one pulse from a prescribed number of pulses (10 pulses in an example below).

According to a signal that indicates a portion to which an index has been given, the signal being output from the threshold comparator 14, the replacing unit 16 replaces the portion indicated by the signal S1 with the output from the corresponding thinning unit 15.

The band elimination filter_digital (BEF_D) 17 is a digital filter that functions so as to prevent an output received from the replacing unit 16 from passing if the output is in a prescribed band and allows the output to pass if it is in another band.

The digital-to-analog converter (D/A) 19 performs digital-analog conversion on an output from the band elimination filter_digital (BEF_D) 17.

Figure 3A:
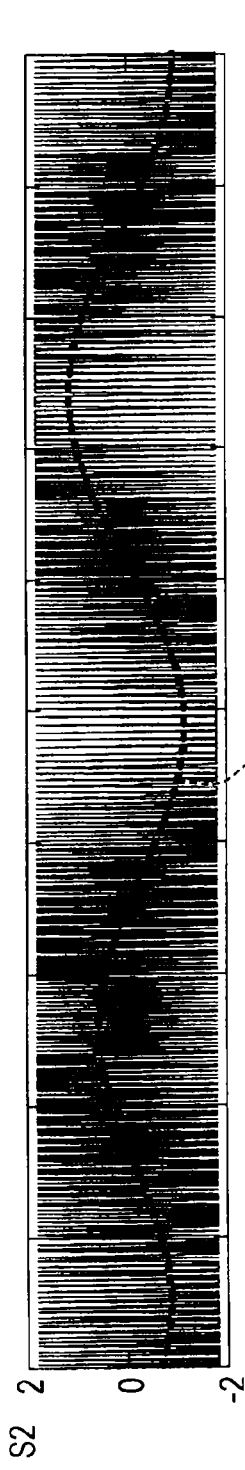
FIGS. 3(a) to 3(c) illustrate the operation of the power amplifier in FIG. 1.
Figure 3B:
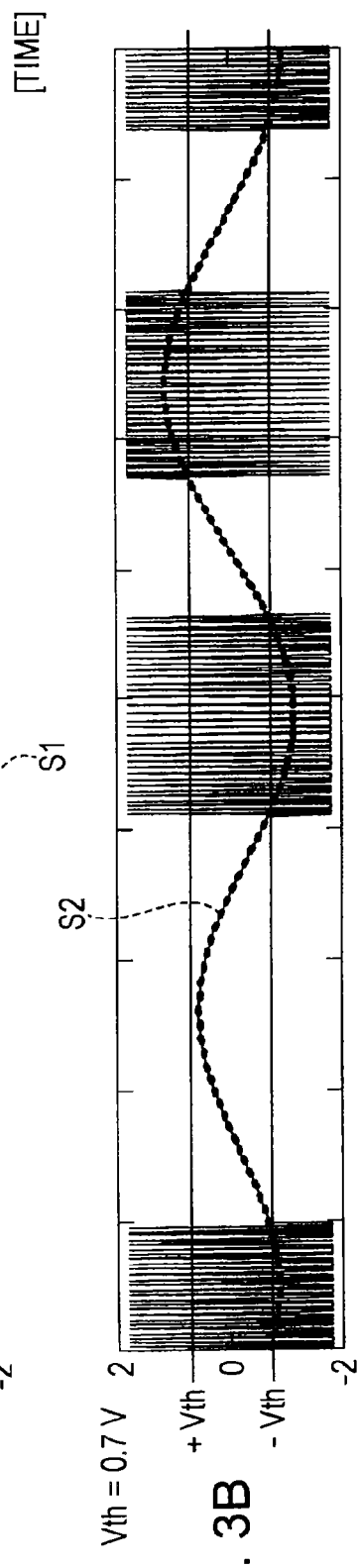

Next, the operation of the power amplifier in FIG. 1 will be described with reference to FIGS. 3(*a*) to 3(*c*). FIG. 3(*a*) shows the PDM-modulated pulse waveform of the signal S2 output from the sigma-delta modulator 13. For convenience, the waveform of the signal S1 to be modulated is also indicated by a broken line by overlapping the waveform on the PDM-modulated pulse waveform (signal S2). The signal S2 is obtained by performing sigma-delta modulation with a clock having a frequency 50 times as high as the frequency of the signal S1 (envelope component). It is found that in the PDM-modulated pulse waveform, the pulse density is high in a portion in which the signal S1 largely changes and is low in a portion in which the change is small.

FIG. 3(*b*) shows a situation in which when the threshold comparator 14 applies positive and negative thresholds (voltages) +Vth and −Vth to the signal S1, the output from the sigma-delta modulator 13 is made effective only a period during which the absolute value of the signal S1 exceeds Vth. Sigma-delta modulation is performed only in a portion in which the absolute value of the voltage to be compared with the threshold of the threshold comparator 14 is Vth or larger. In this example, Vth is set to 0.7 V, so sigma-delta modulation has not been performed in a portion in which the voltage to be compared is 0.7 V or lower.

FIG. 3(*c*) shows the waveform of a signal S3 output from the replacing unit 16. In FIG. 3(*c*), portions, shown in FIG. 3(*b*), of the signal S2 in other than the periods during which the PDM-modulated pulse waveform takes effect are replaced with the signal S1, and PDM-modulated pulses in the effective periods are removed at a prescribed ratio. FIG. 3(*c*) shows an example in which pulses in FIG. 3(*b*) have been reduced to one-tenth. The drawing indicates a state in which the number of pulses has been reduced. If a value by which thinning is performed is 10, each tenth pulse is left and 1 or −1 is embedded for all other pulses. Here, +/−1 is a value equivalent to the amplitude value of the pulse. In the case in FIG. 3(*c*), this amplitude value is set to 1.8 V. As this value, a value that is a little larger than the maximum value of the signal S1 (envelope component) is used.

For convenience, the structure in FIG. 3(*b*) is described as indicating that sigma-delta modulation is performed only in portions in which the absolute value of the envelope voltage is Vth or larger. That is, in this structure, "replacement" is performed first, after which "thinning" is performed. However, the structure may be such that replacement is performed after thinning has been performed, as shown in the block diagram in FIG. 1.

Figure 4A:
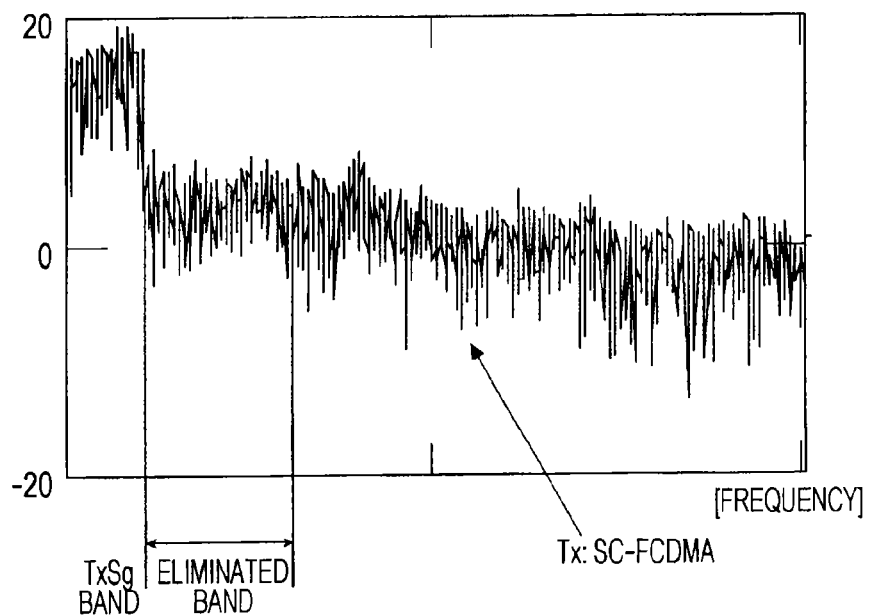
FIG. 4(a) shows the spectrum of a signal S3 in a case in which this filter is not used.
Figure 4B:
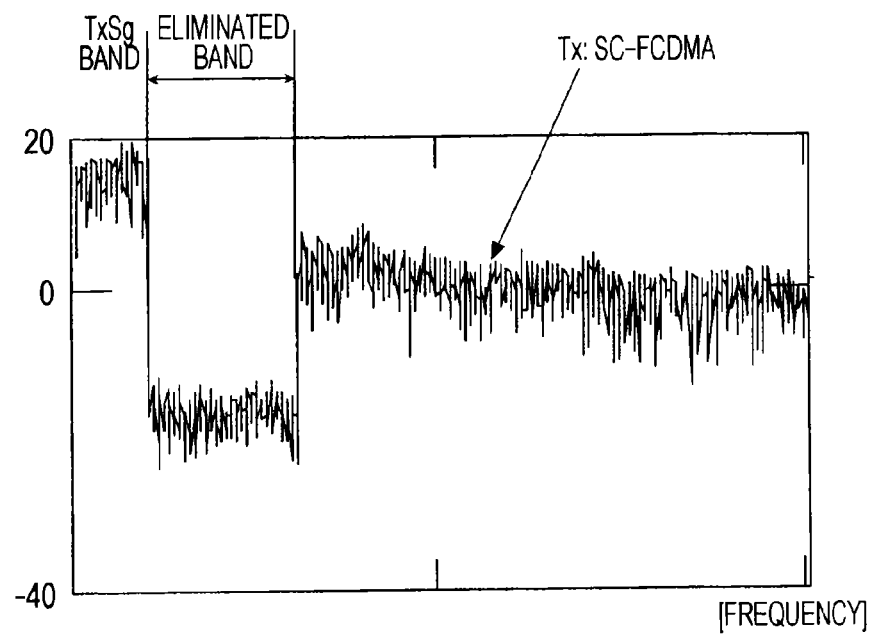
FIG. 4(b) shows a spectrum after filtering by this filer.

The signal S3 obtained in this way passes through the band elimination filter_digital (BEF_D) 17. This filter can be mounted as, for example, an FIR filter. This operation will be described with reference to FIGS. 4(*a*) and 4(*b*). FIG. 4(*a*)

shows the spectrum of the signal S3 in a case in which the band elimination filter_digital (BEF_D) 17 is not used, and FIG. 4(b) shows a spectrum after filtering by the band elimination filter_digital (BEF_D) 17. This filter cuts off the component of a frequency band immediately adjacent to a transmission band (TxSg). The band to be cut is about a transmission bandwidth. An object of this is to reduce adjacent-channel leakage power, which is generated depending on the non-linearity of the power amplifier.

This spectrum component will be briefly described. During sigma-delta modulation, a component near the transmission signal is at a low level. In this embodiment, sigma-delta modulation is performed only in portions in which the envelope is Vth or larger and thinning is also performed, so the pulse density is reduced. As a result, the spectrum near the transmission band is increased when compared with conventional sigma-delta modulation. If this component is cut off, information is lost during reproduction. This loss appears as a loss in portions in which the envelope is Vth or larger. This results in an incompletely decoded signal in the transmission band. In general, the amount of this incompleteness is stipulated with an EVM. In the 3GPP standard, this amount needs to be 17% or less (in the case of QPSK).

This EVM is estimated to be increased due to the non-linearity of the power amplifier. In this embodiment, however, a signal that has been subjected to sigma-delta modulation is amplified, so there is essentially no EVM deterioration due to the non-linearity of the power amplifier. Even if a setting is made so that the EVM deterioration due to the above signal loss falls within the range of the standard, there is no more deterioration factor. Thus, a requirement for decoding characteristics is satisfied as a whole.

Since, in this embodiment, the pulse density is reduced due to the effect of the thinning unit 15, a power amplifier that has been conventionally used can be utilized without having to use a specific switching power amplifier on a later stage. That is, although operation with a 1-GHz switching pulse is required to pass a conventional sigma-delta modulated signal by using a power amplifier, in the method in this embodiment, switching at 100 MHz is sufficient. This enables the use of a power amplifier the switching characteristics of which is not high. This means that even if a power amplifier used in communication in a conventional method is mixed with the method in this embodiment, an additional power amplifier is unnecessary, so a more versatile method can be achieved.

All processing described above up to the band elimination filter_digital (BEF_D) 17 is performed by digital processing. This digital signal is converted to an analog signal by the digital-to-analog converter (D/A) 19 and is input to the power amplifier on a later stage.

FIG. 5 is a block diagram showing a first example of the structure of a power amplifier that uses the sigma-delta modulation apparatus 24 shown in FIG. 1.

The power amplifier includes an envelop creating unit (Env) 22 that receives modulated outputs I and Q from a digital modulator (DM) 21, which creates a digital transmission signal in digital communication, and outputs its envelope component, a phase creating unit (Phase) 23 that similarly receives the modulated outputs I and Q and creates their phase components, a sigma-delta modulation apparatus 24 that receives an output from the envelop creating unit (Env) 22, a mixer (MIX) 26 that creates a sigma-delta quadrature modulated signal by using an output from the sigma-delta modulation apparatus 24 and an output from the phase creating unit (Phase) 23, and a power amplifier (PA) 27 that receives the sigma-delta quadrature modulated signal and amplifies it to a desired output. In this embodiment, a delay circuit 25 is inserted for one of two inputs to the mixer (MIX) 26 to establish synchronization in time between an amplitude signal (envelope) and a phase signal (phase component).

An envelope component Env and a phase component Phase can be calculated from the first and second quadrature outputs I and Q from the digital modulator (DM) by using equations (1) and (2) below, respectively.

$$Env=\sqrt{(I^2+Q^2)} \qquad \text{Equation (1)}$$

$$Phase=\tan^{-1}(Q/I) \qquad \text{Equation (2)}$$

Sigma-delta modulation is performed on the Env component by the sigma-delta modulation apparatus 24 shown in FIG. 1. A quadrature signal is created by multiplying the output from the sigma-delta modulation apparatus 24 and the output from the phase creating unit (Phase) 23 with the multiplying unit (MIX) 26 to combine them and is input to the power amplifier (PA) 27. As a time adjustment mechanism that prevents a time delay from occurring between an Env signal and a Phase signal, the delay circuit 25 as described above may be inserted in one path. In the structure in FIG. 5, the delay circuit 25 is inserted in the path of Phase.

Figure 6:
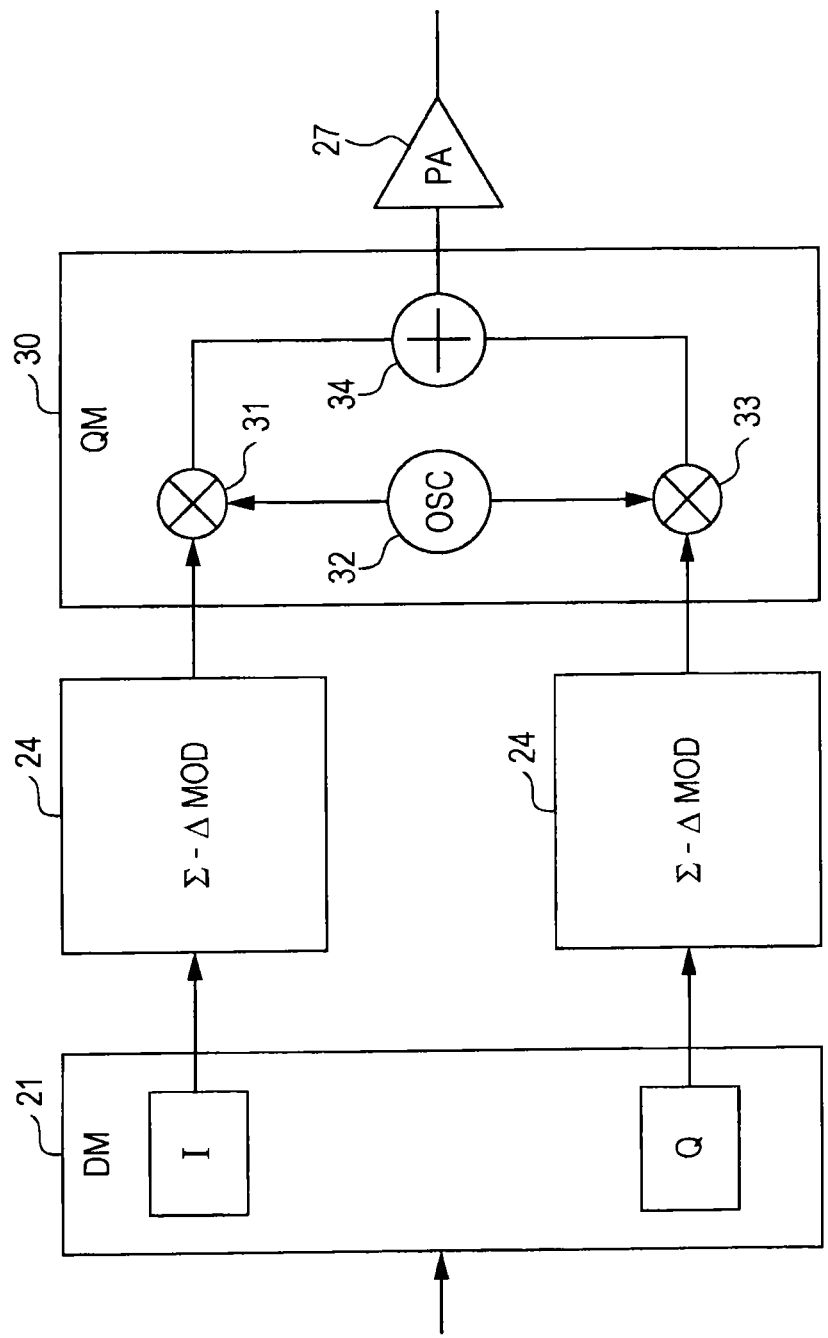
FIG. 6 is a block diagram showing a second example of the structure of a sigma-delta modulation power amplifier that uses the sigma-delta modulation apparatus shown in FIG. 1.

Next, FIG. 6 shows a second example of the structure of a power amplifier that uses the sigma-delta modulation apparatus 24 shown in FIG. 1. In the first example of the sigma-delta modulation power amplifier shown in FIG. 5, the amplitude component and phase component, on which sigma-delta modulation has been performed, are input to the power amplifier through different paths, so time synchronization is needed between them.

In the structure in FIG. 6, two sigma-delta modulation apparatuses 24 having the same structure are prepared to perform the same processing on the quadrature outputs I and Q from the digital modulator 21. When the sigma-delta modulation apparatus 24 is applied to a power amplifier described later, the outputs I and Q are input to a quadrature modulator (QM) 30 to up-convert them to radio frequencies, after which amplification is performed with the power amplifier 27.

The sigma-delta modulation power amplifier in FIG. 6 has the digital modulator (DM) 21, first and second sigma-delta modulation apparatuses 24, the quadrature modulator (QM) 30 and the power amplifier (PA) 27. The first and second sigma-delta modulation apparatuses 24 each receive two digital outputs I and Q of the digital modulator (DM) 21. The quadrature modulator (QM) 30 receives the outputs from the first and second sigma-delta modulation apparatuses 24 as first and second quadrature components and performs quadrature modulation on them. The quadrature modulator (QM) 30 has a known structure including first and second multipliers 31 and 33, an oscillator 32, and an adder 34. The power amplifier (PA) 27 receives an output from the quadrature modulator (QM) 30 and amplifies the output to a desired output level.

In this embodiment, sigma-delta modulation in the above embodiment is performed on each of the quadrature outputs I and Q. Thus, time synchronization becomes unnecessary in the multiplication of the envelope component and the phase component. This type of time synchronization is essential to conventional sigma-delta modulation, and high precision is required for this synchronization. If synchronization is incomplete, restoration of a signal becomes difficult. In this embodiment, this difficulty can be avoided.

Next, the second structure of the sigma-delta modulation power amplifier will be described with reference to FIGS. 7(a), 7(b), and 8.

Figure 7A:
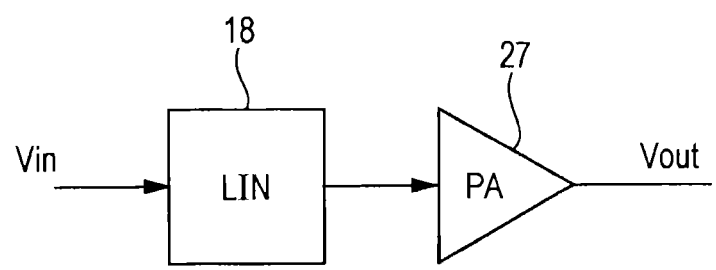
FIG. 7(a) shows the structure of a power amplifier (PA) in which a linearizer (LIN) is placed in a stage in front of a power amplifier.
Figure 7B:
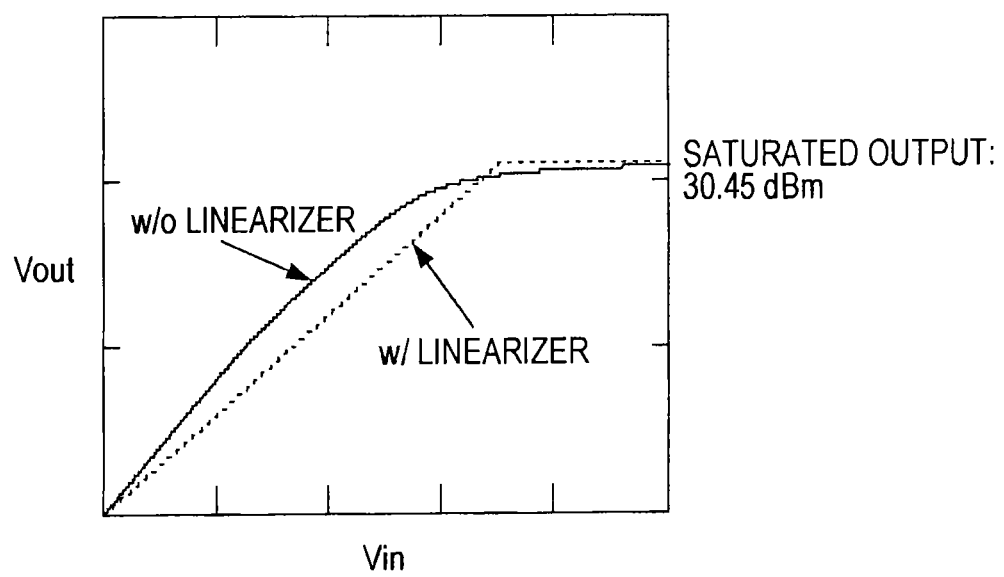
FIG. 7(b) shows the input/output characteristics of the power amplifier to illustrate an effect obtained by using the linearizer.

FIG. 7(a) shows the structure of a power amplifier in which a linearizer (LIN) 18 is placed in a stage in front of the power amplifier (PA) 27. There are already many reports about the linearizer 18. FIG. 7(b) shows the input/output characteristics of the power amplifier to illustrate an effect obtained by using the linearizer 18. That is, this power amplifier performs linear operation to its saturated output and performs clipping operation at the saturated output, as indicated by the broken line graph in FIG. 7(b).

Even in conventional sigma-delta modulation in which the linearizer 18 is not used, if a clock is at high speed and its transient area takes a certain time or if the switching speed of a power amplifier is slow, a distorted component is generated in a frequency range close to the transmission band due to an effect of the non-linearity of the power amplifier. Thus, a method in which the power amplifier is linearized to reduce distortion is proposed. However, there is no specific report on this method in a sigma-delta modulation power amplifier.

Figure 3C:
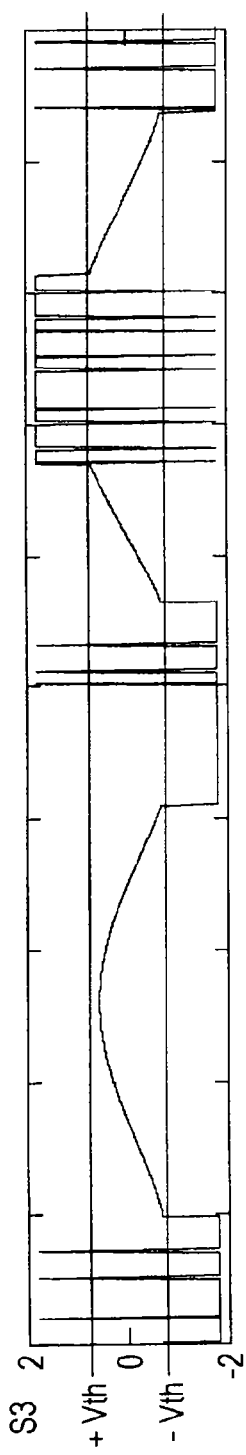

In the sigma-delta modulation apparatus in this embodiment, portions not higher than Vth of the envelope of the signal S3 include analog signals as shown in FIG. 3(c), so if the power amplifier has non-linear characteristics, it generates distortion directly. If the power amplifier is linearized, the effect of suppressing the distortion is obtained.

Figure 8:
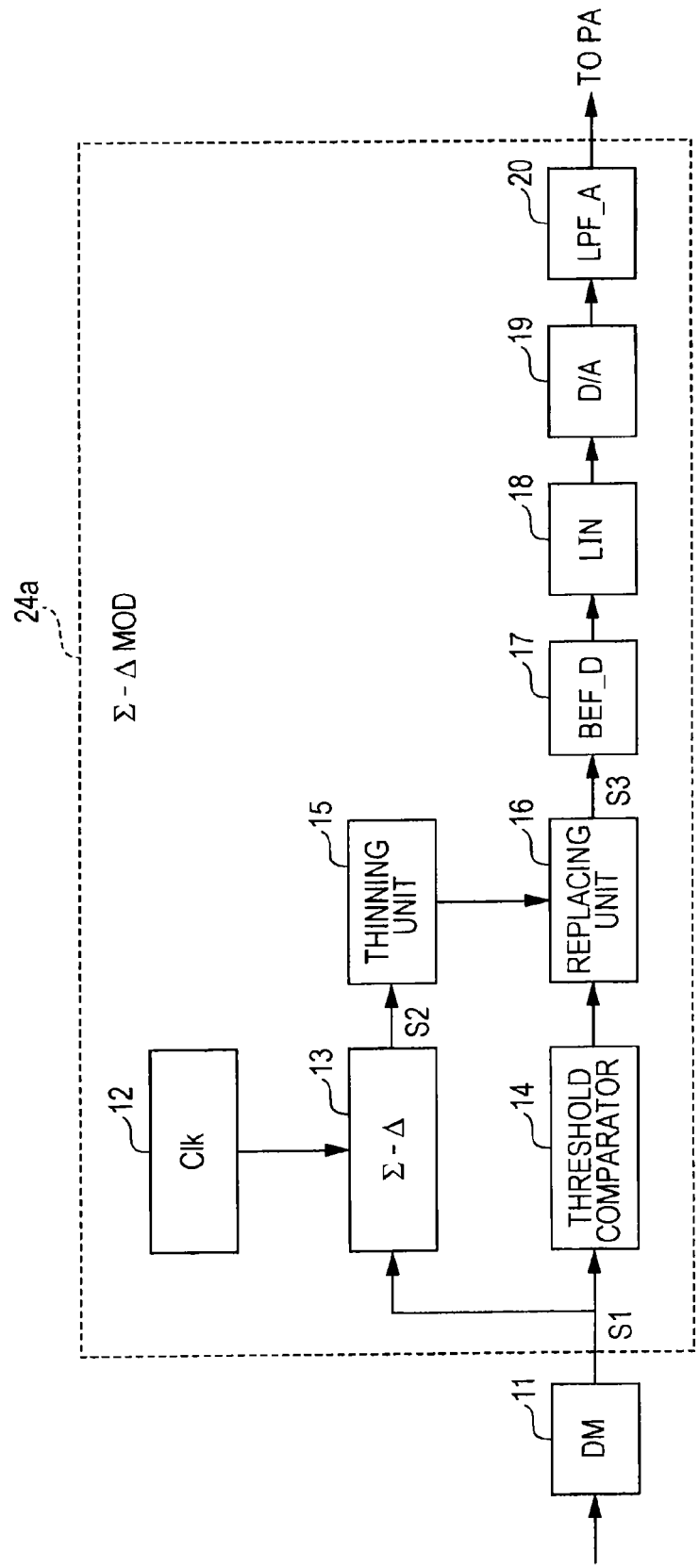
FIG. 8 shows an example of the structure of a sigma-delta modulation apparatus that uses a digital predistorter as the linearizer (LIN).

FIG. 8 shows an example of the structure of a sigma-delta modulation apparatus 24a that uses a digital predistorter as the linearizer (LIN) 18. That is, in the sigma-delta modulation apparatus 24 shown in FIG. 1, the linearizer (LIN) 18 based on a digital predistorter, which linearizes the power amplifier 27 on a later stage, is placed between the band elimination filter_digital (BEF_D) 17 and the digital-to-analog converter (D/A) 19. As the digital predistorter, a predistorter in a conventional method such as a look-up table type of predistorter or an approximate polynomial type of predistorter can be used. A low-pass filter (LPF_A) 20 in the D/A output unit is provided to delete noise caused by D/A conversion.

Characteristics and effects in this embodiment will be described with reference to FIGS. 9(a), 9(b), 10, 11, 12(a), and 12(b).

FIG. 9(a) shows four graphs that represent a relationship between an adjacent-channel leakage power ratio (ACPR) [dBc] and an output (Pout) [dBm]. The four graphs correspond to (1) this embodiment in which a linearized power amplifier (PA) is used, (2) a case in which non-linearized power amplifier (simple amplification) is used, (3) a case in which conventional sigma-delta modulation is used, and (4) simple amplification in which a linearized power amplifier is used.

FIG. 9(b) shows parameters used in simulation performed to obtain this relationship. In this embodiment, the value of the clock clk in FIG. 1 is equivalent to 50-fold oversampling and a pulse thinning ratio is one-tenth. That is, oversampling equivalent to 1 GHz is performed on an LTE signal with a signal bandwidth of 20 MHz, and actual sigma-delta modulation is processing equivalent to 100 MHz. Vth is 0.3 V and the maximum voltage in conversion to digital form is 1.8 V as in FIG. 3.

Figure 10:
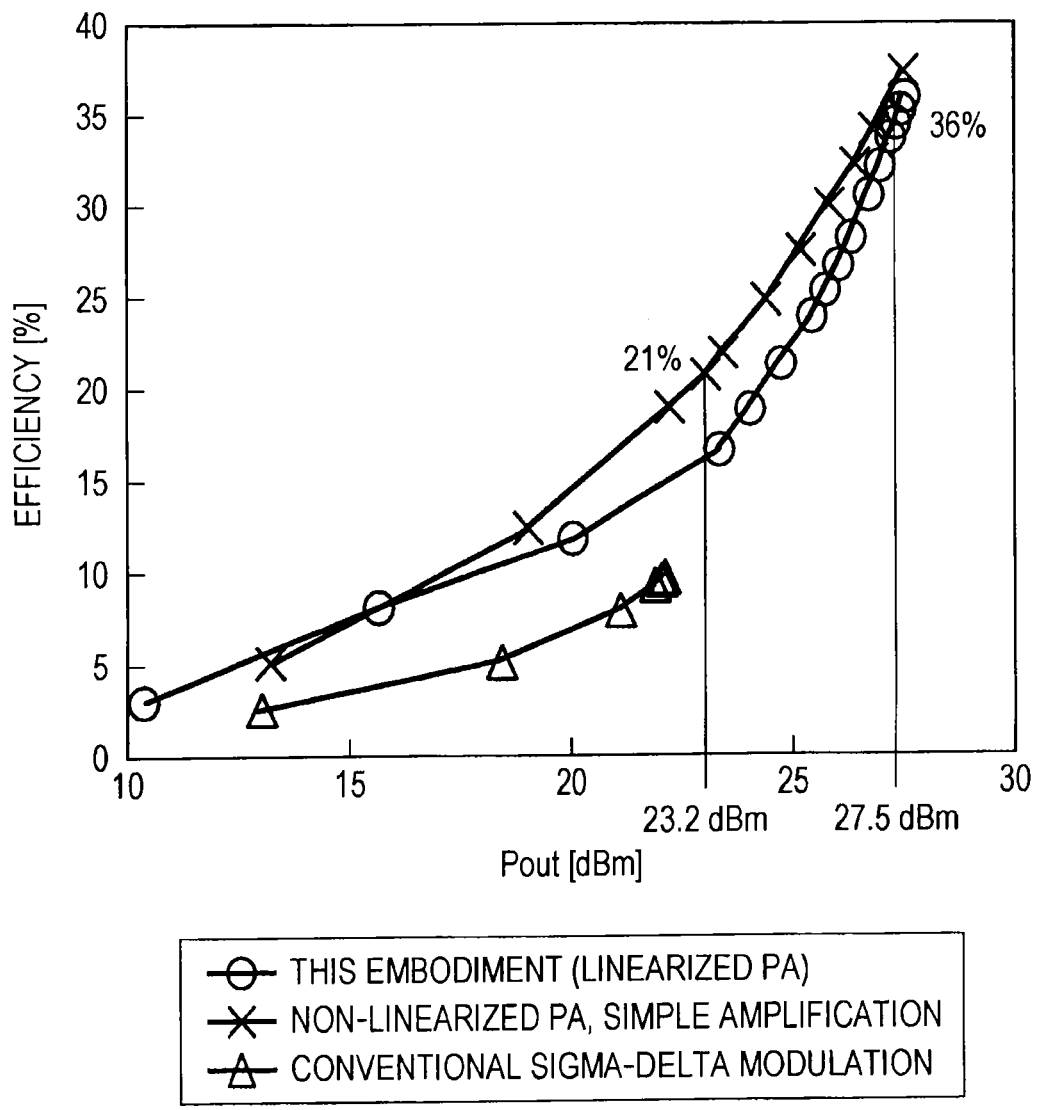
FIG. 10 shows three graphs that represent a relationship between the output (Pout) [dBm] and efficiency [%].

FIG. 10 shows three graphs that represent a relationship between the output (Pout) [dBm] and efficiency [%]. The three graphs correspond to (1) this embodiment in which a linearized power amplifier (PA) is used, (2) a case in which non-linearized power amplifier (simple amplification) is used, and (3) a case in which conventional sigma-delta modulation is used.

In the ACPR diagram in FIG. 9(a), outputs from various power amplifiers are compared at −35 dBc or less, which is the 3GPP standard. When an LTE signal is amplified with this power amplifier, its output is 23.2 dBm. The efficiency at that time is 21% as seen from FIG. 10. This is because the PAPR is 5 dB or more higher than in CDMA2000. When the power amplifier is linearized, its output is 24.7 dBm and the efficiency is about 25%. Accordingly, it is found that this power amplifier cannot be used for LTE without alteration.

When the power amplifier is subjected to conventional sigma-delta modulation, however, its output is 22.1 dBm and no more output is obtained, as shown in FIG. 9(a). The reason for this is that a saturated voltage is reached. In the case of sigma-delta modulation, the power amplifier is always operating on its saturated voltage, so a fixed output is maintained. Since a spectrum is spread over a wide band, however, a signal component is limited to part of a total output. This result reflects an effect by this. The efficiency remains up to 10% as shown in FIG. 10. In this embodiment, the output reaches 27.5 dBm (FIG. 9(a)) and the efficiency reaches 36% (FIG. 10), so it can be said that the power amplifier can substantially withstand practical use.

FIG. 11 shows three graphs that represent data of an error vector magnitude (EVM). The three graphs correspond to (1) this embodiment in which a linearized power amplifier is used, (2) a case in which non-linearized power amplifier (simple amplification) is used, and (3) a case in which conventional sigma-delta modulation is used. When an LTE signal is amplified with this power amplifier, the EVM is 2.2% at an output of 23.2 dBm. In the case of conventional sigma-delta modulation, 1% or less is maintained. In this embodiment, however, the EVM is about 10% at an output of 27.5 dBm. This depends on incompleteness in restoration of a portion in which an envelope is high as described above. In the 3GPP standard, however, 17% or less is only needs to be satisfied. This embodiment satisfies this.

Figure 12A:
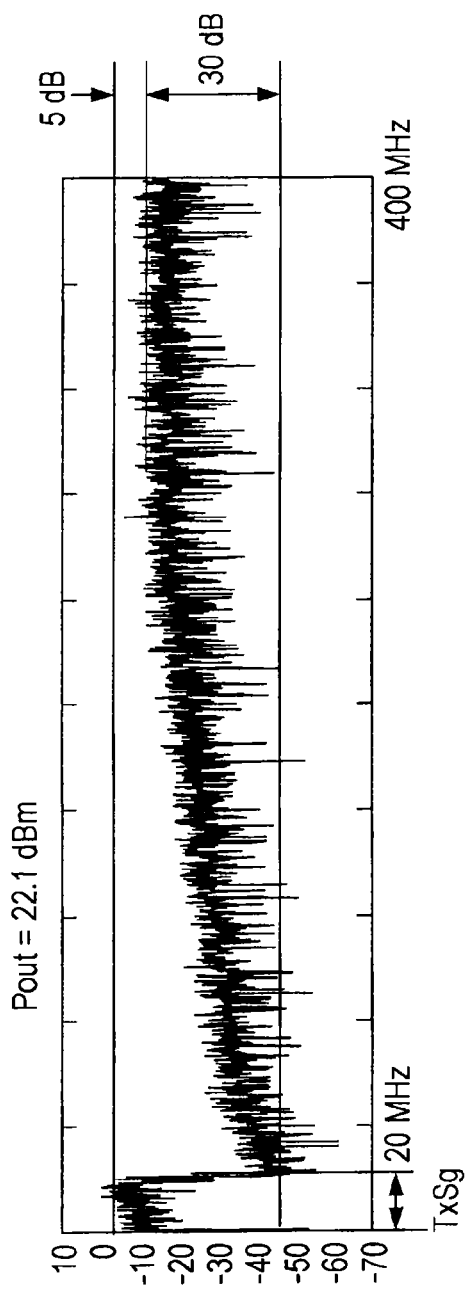
FIGS. 12(a) and 12(b) show graphs that represent spectral characteristics of outputs from the sigma-delta modulation power amplifier in this embodiment and the conventional sigma-delta modulation power amplifier.
Figure 12B:
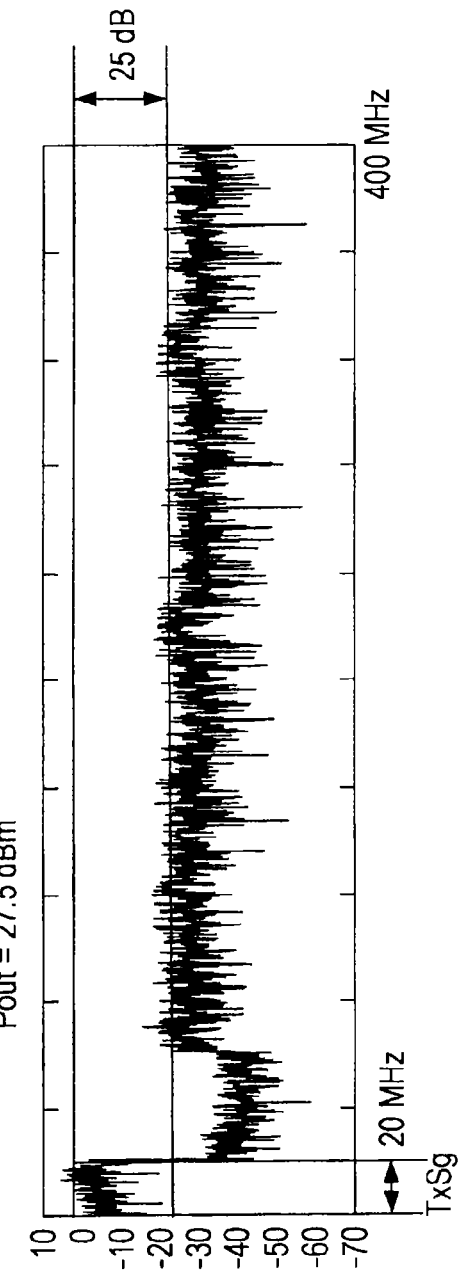

FIGS. 12(a) and 12(b) show graphs that represent spectral characteristics of outputs from the sigma-delta modulation power amplifier in this embodiment and the conventional sigma-delta modulation power amplifier. These drawings show a result in this embodiment and also show, for comparison purposes, results of a case in which the conventional sigma-delta modulation power amplifier is used and a case in which any signal processing is not performed. These drawings are based on simulation. The power amplifier used is a one that is practically used for the CDMA2000. It is structured with two GaAs HBTs having an InGaP emitter. Its AM-AM AM-PM, and efficient characteristics were actually measured and simulation was performed. The saturated outputs of the linearized power amplifier in this embodiment and a non-linearized power amplifier were made to be the same.

The horizontal axis of the graphs in FIGS. 12(a) and 12(b) indicates detuning points up to 400 MHz. Outputs in the graphs in FIGS. 12(a) and 12(b) differ. In the output in conventional sigma-delta modulation shown in FIG. 12(a), the noise level is increased as detuning is increased. At a detuning point of 400 MHz, the noise level is increased by 30 dB from the vicinity of the signal and a difference from the signal level is reduced to only 5 dB. When detuning is further increased, the noise level is further increased.

In this embodiment shown in FIG. 12(b), an increase in noise level is not shown. A recess in the vicinity of the signal area at the left end in this drawing is formed by an effect of a filtering by the band elimination filter_digital (BEF_D) 17.

A problem with this characteristic is generally noise in a reception band. As for this, the detuning frequency varies depending on the standard for the band used. If detuning is large, noise can be easily shut off by a duplexer disposed in power amplifier output. If detuning is close, it is difficult to shut off noise. When a portion close to the transmission band is seen, in this embodiment, noise can be reduced by the band elimination filter_digital (BEF_D) 17.

From an experimental design of a power amplifier in 3GPP, an output of 27 dBm or more and an efficiency of about 40% are obtained from the power amplifier in, for example, CDMA2000.

According to this embodiment, especial effects as described below are obtained.

First, a method is applied in which sigma-delta modulation is performed only in a portion in which the output voltage of a digital modulator (DM) is high and analog components are used in other portions. This eliminates the need for a high-speed clock. Since the high-frequency component is eliminated, noise components over a wide band are also reduced. When the noise components are reduced, energy is collected in the signal. As a result, the efficiency of the power amplifier is improved.

Second, processing to reduce the number of pulses in sigma-delta modulation is performed. This can further lower the clock speed.

Third, distortion can be reduced by using a linearized power amplifier and thereby operation near a saturation point becomes possible. Thus, high efficiency also becomes possible.

Fourth, a conventional power amplifier rather than a special switching power amplifier can be used.

Fifth, in an embodiment in which sigma-delta modulation is performed on both modulated outputs I and Q, there is no need to create a phase component, so time synchronization between an amplitude signal and a phase signal naturally becomes unnecessary.

As described so far, embodiments in the present invention include the following various aspects.

(1) A sigma-delta modulation apparatus that includes a sigma-delta modulator that creates a sigma-delta modulated signal, which is a PDM-modulated pulse, for a digital output from a digital modulator that creates a digital transmission signal in digital communication, according to a clock given in advance, a threshold comparator that gives an index to a portion in which the level of a digital output from the digital modulator is higher than a predetermined threshold and sends the resulting output, a replacing unit that replaces the portion to which the index has been given, the portion being part of the output from the threshold comparator, with an output from the corresponding thinning unit, a filter unit that performs band elimination filter processing on an output from the replacing unit by a digital filter, and a D/A converting unit that performs digital-to-analog conversion on an output from the filter unit.

(2) A sigma-delta modulation power amplifier that includes an envelope creating unit that receives modulated outputs I and Q from a digital modulator, which creates a digital transmission signal in digital communication, and outputs its envelop component, a phase creating unit that receives the modulated outputs I and Q and creates their phase components, a sigma-delta modulation apparatus that receives the output from the envelope creating unit, a mixer that creates a sigma-delta quadrature modulated signal by using an output from the sigma-delta modulation apparatus and an output from the phase creating unit, and a power amplifier that receives an output from the mixer and amplifies the output to a desired output;

the sigma-delta modulation apparatus includes a threshold comparator that gives an index to a portion in which the level of the output from the envelope creating unit is higher than a predetermined threshold and sends the resulting output, a sigma-delta modulator that creates a sigma-delta modulated signal, which is a PDM-modulated pulse, for the digital output from the digital modulator according to a clock given in advance, a thinning unit that removes PDM-modulated pulses output from the sigma-delta modulator at a ratio specified in advance, a replacing unit that replaces the portion to which the index has been given, the portion being part of the output from the threshold comparator, with an output from the corresponding thinning unit, a filter unit that performs band elimination filter processing on an output from the replacing unit by a digital filter, and a D/A converting unit that performs digital-to-analog conversion on an output from the filter unit.

(3) The sigma-delta modulation power amplifier described in (2), which further includes a delay circuit inserted for one of two inputs to the mixer.

(4) The sigma-delta modulation power amplifier described in (2), in which a linearizer is placed in a stage in front of the power amplifier.

(5) A sigma-delta modulation power amplifier that includes first and second sigma-delta modulation apparatuses, each of which receives two modulated outputs I and Q of the digital modulator DM, which creates a digital transmission signal in digital communication, a quadrature modulator that receives outputs from the first and second sigma-delta modulation apparatuses as first and second quadrature components, and a power amplifier that receives an output from the quadrature modulator and amplifies the output to a desired output;

each of the first and second sigma-delta modulation apparatuses includes a threshold comparator that gives an index to a portion in which the output level of the modulated output I or Q is higher than a predetermined threshold and sends the resulting output, a sigma-delta modulator that creates a sigma-delta modulated signal, which is a PDM-modulated pulse, for the digital output from the digital modulator according to a clock given in advance, a thinning unit that removes PDM-modulated pulses output from the sigma-delta modulator at a ratio specified in advance, a replacing unit that replaces the portion to which the index has been given, the portion being part of the output from the threshold comparator, with an output from the corresponding thinning unit, a filter unit that performs band elimination filter processing on an output from the replacing unit by a digital filter, and a D/A converting unit that performs digital-to-analog conversion on an output from the filter unit.

(6) The sigma-delta modulation power amplifier described in (5), in which a linearizer is placed in a stage in front of the power amplifier.

(7) The sigma-delta modulation power amplifier described in (2), which includes the D/A converting unit, which performs digital-to-analog conversion on an output from the filter unit; a digital predistorter, which linearizes the power amplifier on a later stage, is placed between the filter unit and the D/A converting unit.

A sigma-delta modulation apparatus, comprising:
a threshold comparator configured to index a portion of a digital transmission signal from a digital modulator, the portion being higher than a predetermined threshold,
a sigma-delta modulator configured to generate a pulse-density-modulated (PDM) pulse based on the digital transmission signal according to a clock signal,
replacing circuitry configured to replace the portion of the digital transmission signal, indexed by the threshold comparator, with an output portion from a thinning circuit to produce a composite signal,
a filter configured to remove a spectral band from the composite signal, and
a digital to analog (D/A) converter configured to convert the composite signal into an analog signal.

The sigma-delta modulation apparatus wherein the threshold comparator is further configured to index the portion of the digital transmission signal with a signal level that is higher than the predetermined threshold.

The sigma-delta modulation apparatus wherein the predetermined threshold is determined with distortion, efficient output and value of an error vector magnitude (EVM) including parameters of the sigma-delta modulation apparatus.

The sigma-delta modulation apparatus wherein the output from the sigma-delta modulator is used only for periods during which an absolute value of the transmission signal exceeds the predetermined threshold.

The sigma-delta modulation apparatus further including
a clock generator configured to generate the clock signal.

The sigma-delta modulation apparatus further including
the thinning circuit configured to select the generated PDM pulse at a predetermined ratio.

The sigma-delta modulation apparatus further including
linearizing circuitry configured to pre-distort the composite signal so as to suppress a distortion of a power amplifier.

The sigma-delta modulation apparatus wherein the linearizing circuitry is further configured to pre-distort the composite signal using at least one of a look-up table pre-distorter and an approximate polynomial pre-distorter.

The sigma-delta modulation apparatus wherein the D/A converter is configured to convert the pre-distorted composite signal into an analog signal.

The sigma-delta modulation apparatus wherein the filter is a low pass filter configured to exclude digital-analog conversion noise from the converted analog signal and transmit the composite signal to the power amplifier.

The sigma-delta modulation apparatus wherein the filter blocks components of a frequency band immediately adjacent to a transmission band (TxSg) of the composite signal such that a blocked band is equivalent to a single transmission bandwidth.

A sigma-delta modulation power amplifier, including:
envelope creating circuitry configured to envelope modulated I and Q signals generated by a digital modulator,
phase creating circuitry configured to create phase components for the modulated I and Q signals, respectively,
a sigma-delta modulator configured to perform a sigma-delta modulation on the enveloped signals,
delay circuitry configured to delay the phase components from the phase creating circuitry in order to establish synchronization in time between the phase components from the phase creating circuitry and the enveloped signals,
a mixer configured to generate a sigma-delta quadrature modulated signal using the sigma-delta modulated signal and the delayed phase components, and
a power amplifier configured to amplify the generated sigma-delta quadrature modulated signal.

The sigma-delta modulation power amplifier wherein the sigma-delta modulator further comprising
a threshold comparator configured to index a portion of a digital transmission signal, from a digital modulator, the portion being higher than a predetermined threshold,
a sigma-delta modulator configured to generate a pulse-density-modulated (PDM) pulse based on the digital transmission signal according to a clock signal,
replacing circuitry configured to replace the portion of the digital transmission signal, indexed by the threshold comparator, with an output portion from a thinning circuit to produce a composite signal,
a filter configured to remove a spectral band from the composite signal, and
a digital to analog (D/A) converter configured to convert the composite signal into an analog signal.

The sigma-delta modulation power amplifier wherein the phase creating circuitry is configured to envelope the modulated I and Q signals according to:

$$Env=\sqrt{(I^2+Q^2)}$$

wherein I, Q are the output signals from the digital modulator.

The sigma-delta modulation power amplifier wherein the envelope creating circuitry is configured to create the phase components for the modulated I and Q signals according to:

$$\text{phase}=\tan^{-1}(Q/I)$$

wherein I, Q are the output signals from the digital modulator.

A sigma-delta modulation power amplifier, including:
first and second sigma-delta modulation apparatuses, the first sigma-delta modulation apparatus being configured to perform a sigma-delta modulation on a modulated I signal, and the second sigma-delta modulation apparatus being configured to perform a sigma-delta modulation on a modulated Q signal, wherein the modulated I and Q signals are generated by a digital modulator,
a quadrature modulator configured to perform a quadrature modulation on the sigma-delta modulated I and Q signals, and
a power amplifier configured to amplify the quadrature modulated signals,
wherein the first sigma-delta modulation apparatus further comprising
a threshold comparator configured to index a portion of a digital transmission signal from a digital modulator, the portion being higher than a predetermined threshold,
a sigma-delta modulator configured to generate a pulse-density-modulated (PDM) pulse based on the digital transmission signal according to a clock signal,
replacing circuitry configured to replace the portion of the digital transmission signal, indexed by the threshold comparator, with an output portion from a thinning circuit to produce a composite signal,
a filter configured to remove a spectral band from the composite signal, and
a digital to analog (D/A) converter configured to convert the composite signal into an analog signal.

The sigma-delta modulation power amplifier wherein the quadrature modulator includes:
first and second multipliers, each multiplier configured to up-convert the sigma-delta modulated I and Q signals, respectively and
an adder configured to add the up-converted sigma-delta modulated I and Q signals into the quadrature modulated signals.

A sigma-delta modulation method, including:
generating a digital transmission signal by a digital modulator, indexing a portion of a digital transmission signal by a threshold comparator, the portion being higher than a predetermined threshold, generating a pulse-density-modulated (PDM) pulse by a sigma-delta modulator based on the digital transmission signal and in accordance with a clock signal, replacing the portion of the digital transmission signal, by replacing circuitry, with an output portion from a thinning circuit, producing a composite signal, removing a spectral band from the composite signal by a filter, and converting the composite signal into an analog signal by a digital to analog converter.

The sigma-delta modulation method, further including:

linearizing the composite signal by a linearizing circuitry in order to suppress the distortion of a power amplifier.

The sigma-delta modulation method wherein the linearizing circuitry is further configured to pre-distort the composite signal using at least one of a look-up table pre-distorter and an approximate polynomial pre-distorter.

Although preferred embodiments of the present invention have been described, various variations and modifications can be made besides those described above. That is, it will be understood by those skilled in the art that various modification and combinations and other embodiments may be derived from design or other elements within the range of the claims or an equivalent range of the claims.

REFERENCE SIGNS LIST

11 . . . digital modulator (DM): Digital Modulator
12 . . . clock generator (Clk): Clock Generator
14 . . . threshold comparator (Vth): Threshold Comparator
15 . . . thinning unit: Thinning Unit
16 . . . replacing unit: Replacing Unit
17 . . . band elimination filter_digital (BEF_D): Band Elimination Filter_Digital
18 . . . linearizer (LIN): Linearizer
19 . . . digital-to-analog converter (D/A)
21 . . . digital modulator (DM)
24, 24a . . . sigma-delta modulation apparatus: Sigma-Delta Modulation Apparatus
25 . . . delay circuit: Delay Circuit
27 . . . power amplifier (PA): Power Amplifier

What is claimed is:

1. A sigma-delta modulation apparatus, comprising:
circuitry configured to:
index a portion of a digital transmission signal from a digital modulator, the portion being higher than a predetermined threshold;
generate a pulse-density-modulated (PDM) pulse based on the digital transmission signal according to a clock signal;
replace the indexed portion of the digital transmission signal with an output portion from a thinning circuit to produce a composite signal;
remove a spectral band from the composite signal; and
convert the composite signal into an analog signal.

2. The sigma-delta modulation apparatus of claim 1, wherein the circuitry is further configured to index the portion of the digital transmission signal with a signal level that is higher than the predetermined threshold.

3. The sigma-delta modulation apparatus of claim 2, wherein the predetermined threshold is determined with parameters of the sigma-delta modulation apparatus including distortion, efficient output and value of an error vector magnitude (EVM).

4. The sigma-delta modulation apparatus of claim 3, wherein the generated PDM pulse is used only for periods during which an absolute value of the transmission signal exceeds the predetermined threshold.

5. The sigma-delta modulation apparatus of claim 1, wherein the circuitry is further configured to generate the clock signal.

6. The sigma-delta modulation apparatus of claim 1, wherein the thinning circuit is configured to select the generated PDM pulse at a predetermined ratio.

7. The sigma-delta modulation apparatus of claim 1, wherein the circuitry is further configured to pre-distort the composite signal so as to suppress a distortion of a power amplifier.

8. The sigma-delta modulation apparatus of claim 7, wherein the circuitry is further configured to pre-distort the composite signal using at least one of a look-up table pre-distorter and an approximate polynomial pre-distorter.

9. The sigma-delta modulation apparatus of claim 7, wherein the circuitry is further configured to convert the pre-distorted composite signal into an analog signal.

10. The sigma-delta modulation apparatus of claim 1, wherein the circuitry is further configured to exclude digital-analog conversion noise from the converted analog signal and transmit the composite signal to a power amplifier.

11. The sigma-delta modulation apparatus of claim 10, wherein the circuitry is further configured to block components of a frequency band immediately adjacent to a transmission band (TxSg) of the composite signal such that a blocked band is equivalent to a single transmission bandwidth.

12. The sigma-delta modulation apparatus of claim 1, wherein the ciruitry is further configured to index the portion of the digital transmission signal by marking the portion with an indicator that indicates that an absolute value of the digital transmission signal in the portion is greater than the predetermined threshold.

13. A sigma-delta modulation power amplifier, comprising:
circuitry configured to:
envelope modulated I and Q signals generated by a digital modulator;
create phase components for the modulated I and Q signals, respectively;
perform a sigma-delta modulation on the enveloped signals, wherein performing the sigma-delta modulation includes indexing a portion of a digital transmission signal, the portion being higher than a predetermined threshold;
delay the phase components in order to establish synchronization in time between the phase components and the enveloped signals;
generate a sigma-delta quadrature modulated signal using the sigma-delta modulated signal and the delayed phase components; and
amplify the generated sigma-delta quadrature modulated signal.

14. The sigma-delta modulation power amplifier of claim 13, wherein the circuitry is further configured to:
generate a pulse-density-modulated (PDM) pulse based on the digital transmission signal according to a clock signal;

replace the indexed portion of the digital transmission signal with an output portion from a thinning circuit to produce a composite signal;
remove a spectral band from the composite signal; and
convert the composite signal into an analog signal.

15. The sigma-delta modulation power amplifier of claim 13, wherein the circuitry is further configured to envelope the modulated I and Q signals according to:

$$Env=\sqrt{(I^2+Q^2)}$$

wherein I, Q are the output signals from the digital modulator.

16. The sigma-delta modulation power amplifier of claim 13, wherein the circuitry is further configured to create the phase components for the modulated I and Q signals according to:

$$phase=\tan^{-1}(Q/I)$$

wherein I, Q are the output signals from the digital modulator.

17. A sigma-delta modulation power amplifier, comprising:
circuitry configured to:
perform a sigma-delta modulation on a modulated I signal;
perform a sigma-delta modulation on a modulated Q signal, wherein the modulated I and Q signals are generated by a digital modulator;
perform a quadrature modulation on the sigma-delta modulated I and Q signals;
amplify the quadrature modulated signals,
index a portion of a digital transmission signal from the digital modulator, the portion being higher than a predetermined threshold;
generate a pulse-density-modulated (PDM) pulse based on the digital transmission signal according to a clock signal;
replace the indexed portion of the digital transmission signal, with an output portion from a thinning circuit to produce a composite signal;
remove a spectral band from the composite signal; and
convert the composite signal into an analog signal.

18. The sigma-delta modulation power amplifier of claim 17, wherein the circuitry is further configured to:
up-convert the sigma-delta modulated I and Q signals; and
add the up-converted sigma-delta modulated I and Q signals into the quadrature modulated signals.

19. A sigma-delta modulation method, comprising:
generating, via circuitry of a sigma-delta modulation apparatus, a digital transmission signal by a digital modulator;
indexing, via the circuitry, a portion of a digital transmission signal by a threshold comparator, the portion being higher than a predetermined threshold;
generating, via the circuitry, a pulse-density-modulated (PDM) pulse by a sigma-delta modulator based on the digital transmission signal and in accordance with a clock signal;
replacing, via the circuitry, the portion of the digital transmission signal, by replacing circuitry, with an output portion from a thinning circuit;
producing, via the circuitry, a composite signal;
removing, via the circuitry, a spectral band from the composite signal by a filter; and
converting, via the circuitry, the composite signal into an analog signal by a digital to analog converter.

20. The sigma-delta modulation method of claim 19, further comprising:
linearizing, via the circuitry, the composite signal in order to suppress the distortion of a power amplifier.

21. The sigma-delta modulation method of claim 20, wherein the linearizing further comprises pre-distorting the composite signal using at least one of a look-up table pre-distorter and an approximate polynomial pre-distorter.

* * * * *